United States Patent [19]
Elliott et al.

[11] Patent Number: 5,206,515
[45] Date of Patent: Apr. 27, 1993

[54] DEEP ULTRAVIOLET PHOTOLITHOGRAPHY AND MICROFABRICATION

[76] Inventors: David J. Elliott, 147 Rice Rd., Wayland, Mass. 01778; Wolfgang Mueller-Herget, 144-07 29th Ave., Flushing, N.Y. 11354

[21] Appl. No.: 752,092

[22] Filed: Aug. 29, 1991

[51] Int. Cl.[5] .................. B23K 26/00; H01L 21/268
[52] U.S. Cl. ...................... 250/492.2; 250/505.1; 250/492.1
[58] Field of Search ............... 250/492.1, 492.2, 505.1

[56] References Cited

U.S. PATENT DOCUMENTS

| | | | |
|---|---|---|---|
| 4,324,854 | 4/1982 | Beauchamp | 430/296 |
| 4,422,754 | 12/1983 | Isohata | 355/43 |
| 4,463,073 | 7/1984 | Miyauchi | 430/5 |
| 4,496,239 | 1/1985 | Isohata | 355/30 |
| 4,538,914 | 9/1985 | Yomoda | 356/400 |
| 4,577,959 | 3/1986 | Yazaki | 355/67 |
| 4,667,109 | 5/1987 | Kano | 250/491.1 |
| 4,734,745 | 3/1988 | Ohta | 355/45 |
| 4,744,615 | 5/1988 | Fan et al. | 219/121.61 |
| 4,749,840 | 6/1988 | Piwczyk | 219/121.69 |
| 4,778,693 | 10/1988 | Drozdowicz | 427/53.1 |
| 4,980,563 | 12/1990 | George et al. | 250/492.1 |

OTHER PUBLICATIONS

Elliott, "Applications and Techniques for Photosensitive Polymers", pp. 32-41, Applications of Photopolymers (1970).

*Primary Examiner*—Bruce C. Anderson
*Attorney, Agent, or Firm*—Fish & Richardson

[57] ABSTRACT

A high resolution, deep UV beam delivery system for exposing a surface, directly or through a mask, for the purpose of photolithography, surface cleaning, microstructuring, pattern microimaging, surface modification or the like includes a deep UV radiation source for generating a beam of deep ultraviolet radiation along a first path; single element variable attenuator apparatus disposed in the first path for adjustment of the deep UV beam energy in the first path; an optical system in the first path for homogenizing and shaping the deep UV beam energy in the first path; a second radiation source for generating visible wavelength radiation along a second beam path; merging structure for merging radiation energy in the first path and radiation energy in the second path for passage along a common third path; beam splitter structure in the third path for directing radiation energy in the third optical path along a fourth optical path angularly offset from the third path; large area mirror structure having a numerical aperture greater than 0.3 disposed in the fourth optical path for directing radiation energy in the fourth optical path onto the surface of a substrate to be processed that is disposed in the fourth path; and an optical sensing system disposed in a fifth optical path aligned with the fourth path and on the side of the beam splitter structure opposite the large area mirror structure for optically viewing the substrate being processed by deep ultraviolet energy in the fourth optical path as illuminated by visible wavelength radiation from the second radiation source.

22 Claims, 2 Drawing Sheets

DEEP ULTRAVIOLET PHOTOLITHOGRAPHY AND MICROFABRICATION

This invention relates to high resolution deep ultraviolet systems for exposing material surfaces to high energy deep ultraviolet radiation for purposes of photolithography surface cleaning, microstructuring, microimaging of patterns and the like.

The processing of very high density integrated circuits requires high resolution systems capable of resolving and exposing portions of the circuit substrate, with or without the use of a mask in the optical path. With the development of very deep UV sources such as excimer lasers (150-250 nanometers) there has been increasing interest and research regarding the use of deep ultraviolet energy for microimaging and microstructuring. Such systems can be used to remove very thin (1,000 angstrom) layers of material without damaging the underlying substrate, and to cut without inducing stress in the underlying substrate, and such systems have high resolution and relatively high reaction rates due to the photon energy of deep UV radiation.

In accordance with one aspect of the invention, there is provided a high resolution, deep UV beam delivery system for exposing a surface, directly or through a mask, for the purpose of photolithography surface cleaning, microstructuring, pattern microimaging, surface modification or the like, the delivery system including a deep UV radiation source for generating a beam of deep ultraviolet radiation along a first path, single element variable attenuator apparatus disposed in the first path for adjustment of the deep UV beam energy in the first path, an optical system in the first path for homogenizing and shaping the deep UV beam energy in the first path; a second radiation source for generating visible wavelength radiation along a second beam path; first merging structure for merging radiation energy in the first path and radiation energy in the second path for passage along a common third path; beam splitter structure in the third path for directing radiation energy in the third optical path along a fourth optical path angularly offset from the third path; and large area mirror structure having a numerical aperture greater than 0.3 disposed in the fourth optical path for directing radiation energy in the fourth optical path onto the surface of a substrate to be processed that is disposed in the fourth path. Preferably, an optical sensing system is disposed in a fifth optical path aligned with the fourth path and on the side of the beam splitter structure opposite the large area mirror structure for optically viewing the substrate being processed by deep ultraviolet energy in the fourth optical path as illuminated by visible wavelength radiation from the second radiation source.

Preferably, the deep UV radiation source is an excimer laser of wavelength in the 150-250 nanometer range (although it will be appreciated that other types of deep UV sources such as gas filled lamps and microwave energized sources may be employed in particular embodiments); the homogenizing optical system in the first path includes two cylindrical lenses and an axicon lens that has a cone angle per side of less than 10°; all of the optical components between the reticle structure and the substrate in the third and fourth optical paths are of the reflective type; the reticle structure is adapted to receive mask structure with an array of lines of about one micrometer width; and the large area mirror structure has a reduction ratio of at least 1:2.

In a particular embodiment, the second radiation source is a mercury or halogen lamp and disposed in the second beam path between the second radiation source and the merging structure are filter structure for excluding infrared radiation from entering the third path and band pass safelight filter structure for excluding ultraviolet and specific visible wavelength radiation detrimental to the photopolymer material of the substrate from impinging on the merging structure; the merging structure includes a member with two parallel, opposed, planar surfaces, one of the surfaces reflecting at least ninety five percent of incident deep UV radiation while simultaneously transmitting approximately 50% of the radiation passing from the visible wavelength radiation source and through the filter structures and the other surface transmitting at least fifty percent of incident visible radiation; the large area mirror structure includes a central obscuration mirror and an apertured mirror disposed in spaced relation along the fourth path; and the attenuator apparatus varies the beam attenuation by a factor of at least five and includes a planar plate of quartz (or other suitable UV transmitting material) mounted for rotation over an angular range of at least thirty degrees, with coating structure (a series of layers of materials of different refractive index in a particular embodiment) on one surface thereof, such coating structure reflecting different amounts of incident deep UV energy as a function of the angle of the incident beam to the coated quartz plate.

That particular embodiment provides capability of varying the UV radiation fluence (MJ/CM$^2$) at the substrate being processed while maintaining energy uniformity of better than $+10°$ over the entire beam area at the substrate workpiece surface; real time viewing of the action of the UV beam on the substrate; accurate and stable alignment with minimal optical components that tend to distort beam images or cause scattering; and substantial deep UV energy for processing of the workpiece surface.

Other features and advantages of the invention will be seen as the following description of a particular embodiment progresses, in conjunction with the drawings, in which.

DESCRIPTION OF PARTICULAR EMBODIMENT

Figure 1:
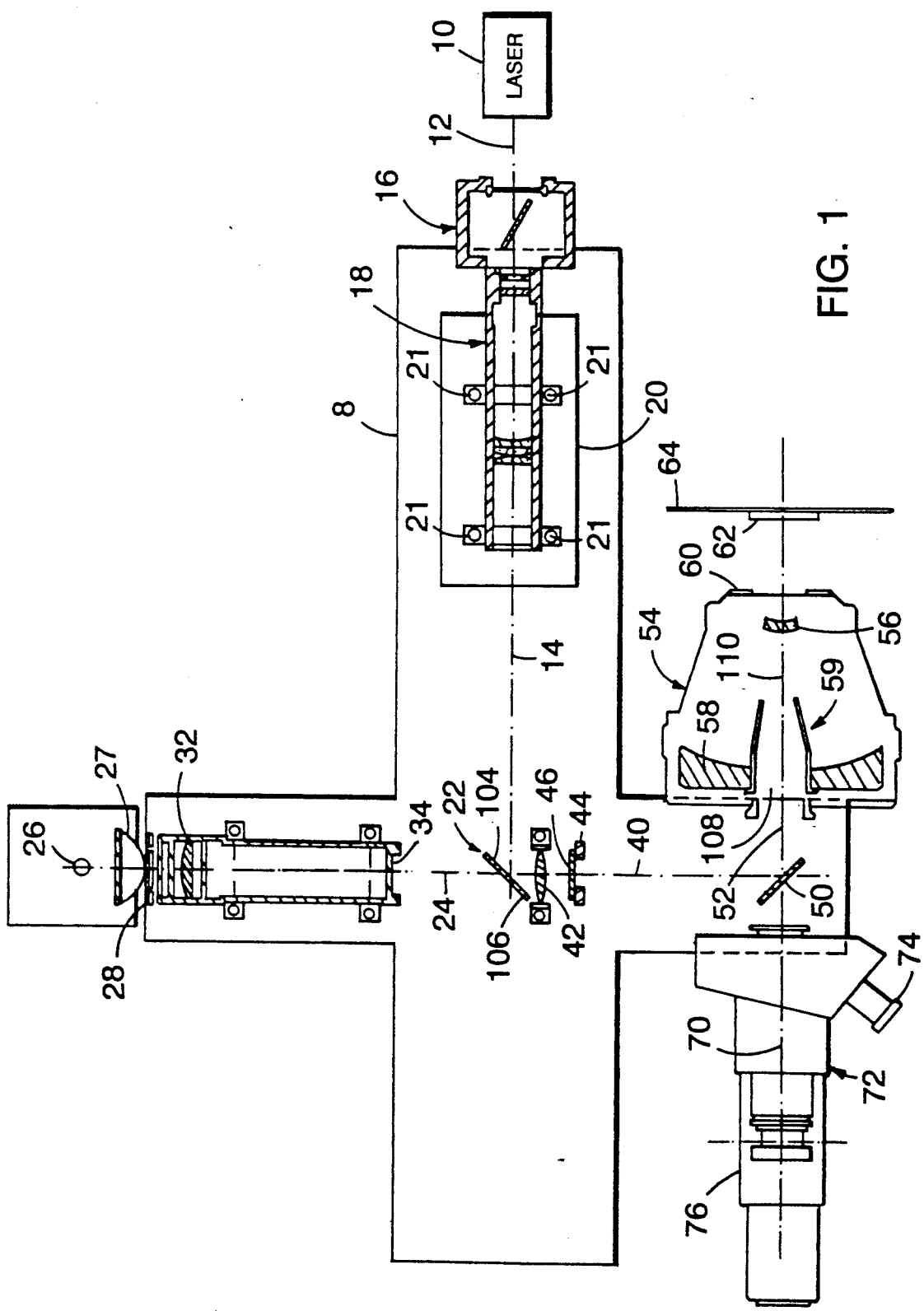
FIG. 1 is a diagram of a processing system in accordance with the invention.

With reference to FIG. 1, the system includes nitrogen purged housing 8 and twenty watt krypton fluoride excimer laser source 10 that generates deep UV (193 nanometer) radiation beam 12 along axis 14 and is spaced about seven centimeters from housing 8. Disposed on axis 14 are variable attenuator 16, homogenizing optics unit 18 that is secured on reference plate 20 in housing 8 by fasteners 21 and planar beam merging structure 22.

Disposed along axis 24 orthogonal to axis 14 are lamp source 26 of visible wavelength radiation; high aperture aspheric condenser lens 27; infrared (heat reflecting) filter 28; yellow bandpass (570-590 nanometers) safelight filter 30; condenser lens 32; field lens 34; and merging structure 22.

The radiation in axes 14 and 24 are merged by planar beam merger 22 for passage along beam path 40 through field lens 42 and two centimeter by two centimeter reticle 44 in which mask 46 with a pattern of lines of one micron width may be disposed.

Planar beam splitter structure 50 is disposed in beam path 40 for redirecting the merged visible and deep UV radiation along beam path 52 for passage through 10× reduction reflector structure 54 that has a numerical aperture of 0.35 and includes central obscuration mirror 56, annular mirror 58 and diffraction shield 60 for imaging a 1:10 image of mask 46 on UV sensitive wafer target structure 62 that is supported on adjustable stage 64 at a distance of forty centimeters along beam paths 40 and 52 from reticle 44.

Disposed on the opposite side of beam splitter 50 from reflector structure 54 on beam path 70 (that is in coincident alignment with beam path 52) is viewing optics 72 that includes eyepiece assembly 74 and video camera optics 76. (In practice, beam paths 52 and 70 are orthogonal to the plane of FIG. 1 and are rotated as shown for clarity of illustration.)

Figure 2:
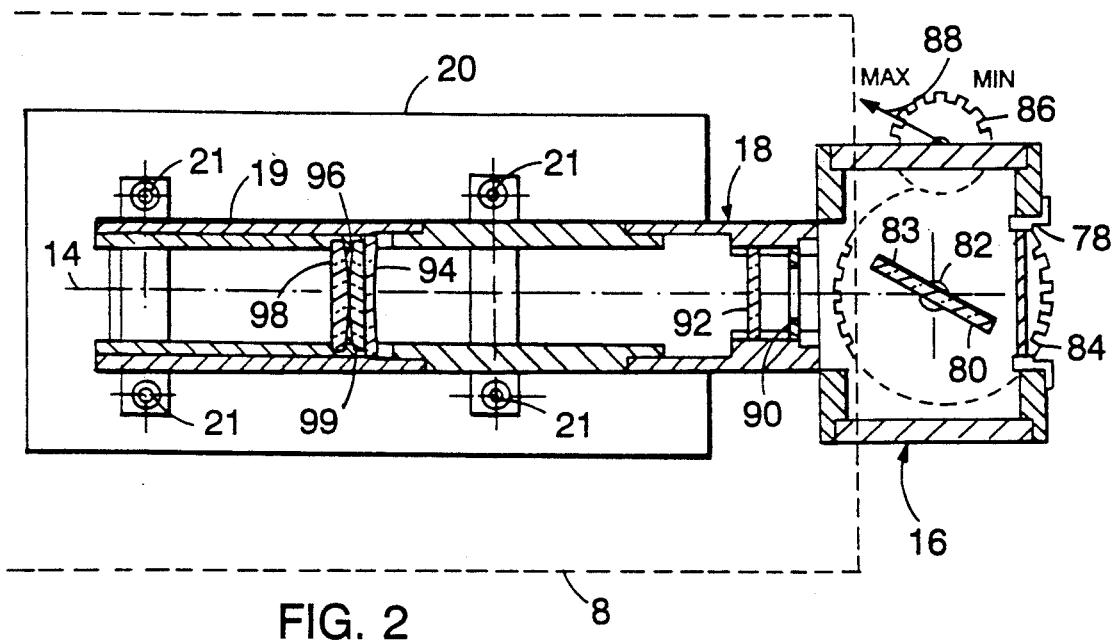
FIG. 2 is a more detailed diagram of attenuator and homogenizing components employed in the system shown in FIG. 1.

Further details of attenuator 16 and homogenizing optics 18 may be seen with reference to FIG. 2. Attenuator housing 16 includes an approximately 25×25 millimeter opening 78 through which UV radiation beam 12 passes and thirty-six×twenty millimeter planar plate 80 of UV transmitting material (such as quartz) that is mounted for rotation on pivot shaft 82 and has multilayer dielectric coating 83 on its surface. Coupled to pivot shaft 82 of plate 80 is gear 84 which engages gear 86 that is in turn coupled to adjustment mechanism 88 for rotating plate 80 over an angular range of 60° between a position in which plate 80 is perpendicular to beam axis 14 and a second position (as illustrated in FIG. 2) which plate 80 is disposed at 60° to beam axis 14.

Homogenizing optics 18 includes aperture member 90 that defines a five×fifteen millimeter aperture; beam shaping cylindrical lens 92; cylindrical lens 94 whose cylindrical lens axis is disposed at right angles to the axis of lens 92; spherical imaging field lens 96; and 2.5 centimeter diameter axicon lens 98 with conical surface 99 that has a cone angle of less than 10° per side (i.e., an included cone angle, also called an inside apex angle, of more than 160°). Preferably, conical surface has a cone angle of 3.75° per side (an included cone angle of about 172.5°) with its apex on axis 14 and that redistributes radiation energy in beam 12 while retaining its imaging qualities. Lens 92 is spaced about one centimeter on axis 14 from aperture 90; lens 94 is spaced about ten centimeters on axis 14 from lens 92; lens 96 is spaced about one millimeter on axis 14 from lens 94; lens 98 is spaced about one millimeter on axis 14 from lens 96; and lens 98 is spaced about twenty-nine centimeters on axis 14 from merging structure 22. Lenses 92, 94, 96 and 98 are mounted in housing 19 that is releasably secured on reference plate 20 by fasteners 21 allowing replacement of the homogenizing optics 18 as a unit for use with a radiation source 10 of different frequency.

Figure 3:
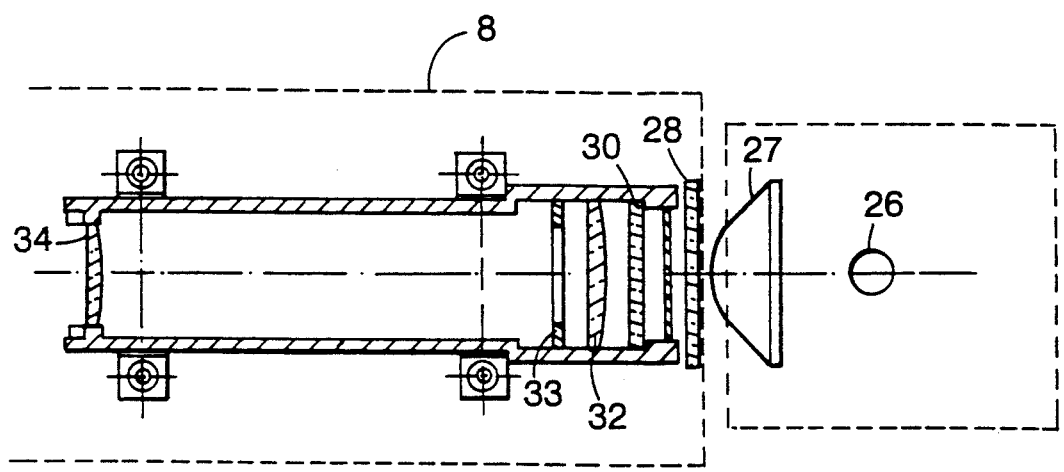
FIG. 3 is a more detailed diagram of components associated with the visible radiation source employed in the system shown in FIG. 1.

With reference to FIG. 3, components disposed in beam path 24 include mercury or halogen filament lamp 26; high aperture aspheric condenser lens 27; heat reflecting filter 28; bandpass safelight filter 30; condenser lens 32; thirty×thirty millimeters aperture structure 33; and field lens 34 that is spaced about thirteen centimeters from aperture structure 33 and about eight centimeters from beam merger 22.

Beam merging structure 22 (FIG. 1) merges the deep UV radiation in beam path 14 and the visible radiation in beam path 24 for passage along beam path 40. Its reflective surface 104 reflects approximately ninety-eight percent of the deep UV radiation in beam path 12. The transmitting surface 106 of beam merging structure 22 transmits sixty percent or more of the visible (570-590 nanometer) radiation in beam path 24; surface 104 in turn transmits at least 50% of such visible radiation to beam path 40. Field lens 42 is disposed about halfway between merger 22 and reticle 44. Reticle 44 is spaced about five centimeters from merger 22 and holds mask 46 and passes modified radiation to dichroic mirror 50 for reflection through mirror system 54 for reducing the image of mask 46 by a factor of ten and directing the radiation through one centimeter diameter aperture of shield 59 along converging path 110 to silicon wafer 62 on stage 64 that is spaced about nine centimeters from obscuration mirror 56. Obscuration mirror 56 has a diameter of about two centimeters. Annular mirror 58 has an outer diameter of about thirteen centimeters and an aperture 108 of about 3.5 centimeters diameter and is disposed about eighteen centimeters from wafer 62; and shield 60 has an aperture of about one centimeter diameter and is spaced about 5 centimeters from wafer 62.

In use, attenuator 16 is adjusted to provide the desired intensity of radiation on substrate 62 at a uniformity over the processed area of ±10 percent; attenuator 16 varies the fluence at wafer 62 from about four millijoules per square centimeter to about fifty-five millijoules per square centimeter, and the processing of wafer 62 can be viewed in real time through eyepiece 72 as well as being recorded through video port 76.

While a particular embodiment of the invention has been shown and described, various modifications will be apparent to those skilled in the art, and therefore, it is not intended that the invention be limited to the disclosed embodiment, or to details thereof, and departures may be made therefrom within the spirit and scope of the invention.

What is claimed is:

1. A high resolution, deep UV beam delivery system for exposing a surface, directly or through a mask, for the purpose of photolithography surface cleaning, microstructuring, pattern microimaging, surface modification or the like, said delivery system including a deep UV radiation source for generating a beam of deep ultraviolet radiation along a first path;

variable attenuator apparatus disposed in said first path for adjustment of the deep UV beam energy in said first path;

an optical system in said first path for homogenizing and shaping the deep UV beam energy in said first path; said homogenizing and shaping optical system including two orthogonally disposed cylindrical lenses and a conical surface lens, a second radiation source for generating visible wavelength radiation along a second beam path, merging structure for merging radiation energy in said first path and radiation energy in said second path for passage along a common third path;

reticle structure in said third path;

beam splitter structure in said third path for directing radiation energy in said third optical path along a fourth optical path angularly offset from said third path; and large area mirror structure having a numerical aperture greater than 0.3 disposed in said fourth optical path for directing radiation energy in said fourth optical path on the surface of a substrate to be processed that is disposed in said fourth path.

2. The system of claim 1 wherein said attenuator apparatus includes a planar plate member mounted for rotation over an angular range of at least thirty degrees.

3. The system of claim 1 wherein the spacing between said orthogonally disposed cylindrical lenses is at least five times the spacing between said conical surface lens and the one of said cylindrical lenses closer to said conical surface lens.

4. The system of claim 1 wherein the conical surface of said conical surface lens has a cone angle per side of less than 10° and its apex is on the axis of said first path.

5. The system of claim 1 and further including safelight filter structure in said second beam path between said second radiation source and said merging structure for excluding particular visible wavelength radiation and ultraviolet radiation in said second beam path from impinging on said merging structure.

6. The system of claim 1 wherein said merging structure includes a member with two parallel, opposed, planar surfaces, one of said surfaces reflecting at least ninety five percent of incident deep UV radiation and transmitting at least fifty percent of visible radiation transmitted by the other of said surfaces, said other of said surfaces transmitting at least fifty percent of incident visible radiation.

7. The system of claim 1 wherein said reticle structure includes structure for receiving mask structure with an array of lines of about one micrometer width and said large area mirror structure has a reduction ratio of at least 1:2.

8. The system of claim 1 and further including an optical sensing system disposed in a fifth optical path aligned with said fourth path and on the side of said beam splitter structure opposite said large area mirror structure for optically viewing the substrate being processed by deep ultraviolet energy in said fourth optical path as illuminated by said visible wavelength radiation from said second radiation source.

9. The system of claim 1 wherein all of the optical components between said reticle structure and said substrate in said third and fourth optical paths are of the reflective type.

10. The system of claim 1 wherein said large area mirror structure includes a central obscuration mirror and an apertured mirror.

11. The system of claim 1 wherein all of the transmitting optical components in said first and third paths are of highly UV transmitting materials.

12. The system of claim 1 wherein said deep UV radiation source is an excimer laser of wavelength in the 150–250 nanometer range.

13. A high resolution, deep UV beam delivery system for exposing a surface, directly or through a mask, for the purpose of photolithography surface cleaning, microstructuring, pattern microimaging, surface modification or the like, said delivery system including a deep UV radiation source for generating a beam of deep ultraviolet radiation along a first path;

variable attenuator apparatus disposed in said first path for adjustment of the deep UV beam energy in the first path; said attenuator apparatus including a plate member mounted for rotation over an angular range of at least thirty degrees, and said attenuator apparatus attenuates beam energy at said substrate over a range between maximum and minimum of at least five times, an optical system in said first path for homogenizing and shaping the deep UV beam energy in the first path;

a second radiation source for generating visible wavelength radiation along a second beam path, merging structure for merging radiation energy in said first path and radiation energy in said second path for passage along a common third path;

reticle structure in said third path;

beam splitter structure in said third path for directing radiation energy in said third optical path along a fourth optical path angularly offset from the third path; and large area mirror structure having a numerical aperture greater than 0.3 disposed in said fourth optical path for directing radiation energy in said fourth optical path on the surface of a substrate to be processed that is disposed in said fourth path.

14. The system of claim 13 wherein said homogenizing and beam shaping optical system includes two orthogonally disposed cylindrical lenses and a conical surface lens.

15. The system of claim 14 wherein the spacing between said orthogonally disposed cylindrical lenses is at least five times the spacing between said conical surface lens and the one of said cylindrical lenses closer to said conical surface lens, the conical surface of said conical surface lens has an inside apex angle of 160° or more and its apex is on the axis of said first path.

16. The system of claim 14 wherein all of the transmitting optical components in said first and third paths are of high purity (>95%) quartz and all of the optical components between said reticle structure and said substrate in said third and fourth optical paths are of the reflective type; and further including a nitrogen purged housing in which said optical components are housed.

17. The system of claim 16 wherein said reticle structure includes structure for receiving mask structure with an array of lines of about one micrometer width and said large area mirror structure has a reduction ratio of at least 1:2.

18. The system of claim 16 wherein and said plate member has a series of layers of high and low refractive index materials on at least one surface thereof.

19. The system of claim 18 and further including safelight filter structure in said second beam path between said second radiation source and said merging structure for excluding particular visible wavelength radiation and ultraviolet radiation in said second beam path from impinging on said merging structure.

20. The system of claim 19 wherein said merging structure includes a member with two parallel, opposed, planar surfaces, one of said surfaces reflecting at least ninety five percent of incident deep UV radiation and transmitting at least fifty percent of visible radiation transmitted by the other of said surfaces, said other of said surfaces transmitting at least fifty percent of incident visible radiation.

21. The system of claim 20 wherein said large area mirror structure includes a central obscuration mirror and a mirror with a cylindrical aperture on the axis of said fourth path between said beamsplitter structure and said obscuration mirror, said obscuration mirror being spaced from said apertured mirror a distance greater than the diameter of said cylindrical aperture; and further including a shield that has an aperture of diameter smaller than the diameter of said cylindrical aperture.

22. The system of claim 21 and further including an optical sensing system disposed in a fifth optical path aligned with said fourth path and on the side of said beam splitter structure opposite said large area mirror structure for optically viewing the substrate being processed by deep ultraviolet energy in said fourth optical path as illuminated by said visible wavelength radiation from said second radiation source.

* * * * *